United States Patent [19]

Gigliotti et al.

[11] 4,292,076
[45] Sep. 29, 1981

[54] TRANSVERSE DUCTILE FIBER REINFORCED EUTECTIC NICKEL-BASE SUPERALLOYS

[75] Inventors: Michael F. X. Gigliotti, Scotia; Melvin R. Jackson, Niskayuna; Michael F. Henry; David A. Woodford, both of Schenectady; Sherwin S. Yang, Clifton Park, all of N.Y.; Charles A. Bruch, Cincinnati, Ohio

[73] Assignee: General Electric Company, Schenectady, N.Y.

[21] Appl. No.: 34,167

[22] Filed: Apr. 27, 1979

[51] Int. Cl.³ .......................................... C22C 19/03
[52] U.S. Cl. ..................................... 75/170; 75/171; 148/32; 148/32.5
[58] Field of Search .................... 75/170, 171; 148/32, 148/32.5

[56] References Cited

U.S. PATENT DOCUMENTS 3,526,499  9/1970  Quigg et al. .......................... 75/171
3,904,402  9/1975  Smashey ............................. 148/32.5

*Primary Examiner*—R. Dean
*Attorney, Agent, or Firm*—F. Wesley Turner; James C. Davis, Jr.; Joseph T. Cohen

[57] ABSTRACT

A unidirectionally solidified anisotropic metallic composite body exhibiting improved high temperature ductility and strength properties comprising a nickel-base refractory-metal-monocarbide-reinforced eutectic superalloy containing boron.

10 Claims, 8 Drawing Figures

TRANSVERSE DUCTILE FIBER REINFORCED EUTECTIC NICKEL-BASE SUPERALLOYS

CROSS REFERENCE TO RELATED APPLICATIONS

This invention is related to copending U.S. patent application Ser. Nos. 34,154 and 34,168 of M. F. Henry, both filed Apr. 27, 1979. The aforesaid applications are assigned to the same assignee as the assignee of this application and all the disclosures contained therein are hereby incorporated herein in their entirety by reference.

BACKGROUND OF THE INVENTION

1. Field of the Invention

This invention relates to a unidirectionally solidified anisotropic metallic composite body exhibiting high temperature transverse ductility and strength properties comprising a nickel-base refractory-metal-monocarbide-reinforced eutectic superalloy containing boron. A reinforcing phase of the eutectic superalloy, is an aligned carbide reinforcing fibrous phase, preferably one selected from the monocarbides of Ti, V, Cb, Zr, Hf, Ta, and their alloys or mixtures thereof.

Illustratively, more preferred Ni-base compositions contain about, on weight basis, 0.5-7.0% Re, less than about 0.8% Ti, and at least an amount in excess of an impurity amount of B. Embedded in the matrix is an aligned carbide reinforcing fibrous phase, preferably one selected from monocarbides of Ta, V and their alloys or mixtures thereof.

2. Description of the Prior Art

Nickel-base eutectics reinforced by refractory metal (Ti, V, Cb, Hf, Zr, Ta) monocarbides are described by Lemkey U.S. Pat. No. 3,528,808, Smashey U.S. Pat. No. 3,904,402, Tarshis et al. U.S. Pat. No. 3,799,769, Walter et al. U.S. Pat. No. 3,793,012, Walter U.S. Pat. No. 3,944,416 and Bibring et al. U.S. Pat. No. 3,871,835. In general, they disclose high strength superalloys obtained from aligned nickel-base fiber-reinforced structures. The focus of the strength improvements in their alloys is in directions parallel to the direction of fiber alignment and unrelated to the alloy characteristics required to provide adequate tensile and rupture ductility properties in directions off axis to the fiber alignment.

Illustratively, Smashey's U.S. Pat. No. 3,904,402, issued Sept. 9, 1975 (filed June 1, 1973) broadly describes eutectic nickel-base alloys containing rhenium and a carbide reinforcing fiber phase exhibiting improved high temperature stress-rupture properties. Smashey teaches the preferred use of 4–7% w/o vanadium for enhancement of carbide fiber as well as matrix strengthening, use of up to about 3% w/o molybdenum (however preferably omits the use of Mo), and the preferred use of about 2–4% w/o tungsten in nickel-base superalloys. Smashey summarily teaches the additive use of vanadium and the restrictive use of molybdenum and tungsten.

Recent evaluations of Smashey's alloys have illuminated a generally limiting brittle (non-ductile) transverse strength characteristic. For example tensile tests performed on specimens of Smashey's alloy Example 13 oriented perpendicular to the direction of fiber alignment have furnished the following data:

| Composition | Transverse Tensile Test Data (As Solidified) | | | |
|---|---|---|---|---|
| | Temp. (°F.) | 0.2% Y.S. | U.T.S. (ksi) | Elong. (%) |
| Smashey's Alloy 13, U.S. 3,904,403 | 1400 | 126 | 126 | 0.2 |
| | 1650 | — | 85 | 0.04 |
| | 1900 | 54 | 55 | 0.64 |

The invention of this application discloses that boron additions to nickel-base refractory metal monocarbide reinforced superalloys markedly improves off-axis tensile and rupture ductility properties.

DESCRIPTION OF THE INVENTION

This invention embodies a unidirectionally solidified anisotropic metallic composite body exhibiting high transverse ductility and strength properties comprising a nickel-base refractory-metal-monocarbide-reinforced eutectic superalloy containing boron. A reinforcing phase of the eutectic superalloy is an aligned carbide reinforcing fibrous phase, preferably one selected from the monocarbides of Ti, V, Cb, Zr, Hf, Ta, and their alloys or mixtures thereof.

Illustratively, a more preferred Ni-base alloy contains about, on a weight percent basis, 0.5-7% Re, less than 0.8% Ti, and at least an amount in excess of an impurity amount of boron. Embedded in the matrix is an aligned carbide reinforcing fibrous phase, preferably a predominantly TaC reinforcing fibrous phase. This more preferred nickel-base alloy exhibits high transverse ductility, cyclic oxidation resistance, and high temperature strength properties, and comprises nickel-base alloys which contain about, on a weight basis, 0.5-7% Re, less than 0.8% Ti, about 0.001-0.02% B, 2-8% Cr, 4-7% Al, 5-13% Ta, 0.1-0.7% C, <5% Co, <6% W, <0.2% V, <5% Mo, <1% Cb, <0.15% Hf, <0.15% Zr, the balance being essentially Ni and incidental impurities.

BRIEF DESCRIPTION OF THE DRAWINGS

" FIG. 1 also illustrates the effects of hafnium, zirconium, lanthanum and boron—elements often considered as candidates for grain boundary strengthening of nickel-base alloys. Further, FIG. 1 illustrates that Hf, Zr, La and B do not modify the alloy's character whereby adequate matrix grain boundary strengthening occurs which would be illustrated by means of ductile transverse tensile behavior. Boron appears to improve—to some extent—the alloy's grain boundary strength as illustrated by an increase in the ultimate tensile strength (U.T.S.) of the boron containing alloy.

Figure 1:
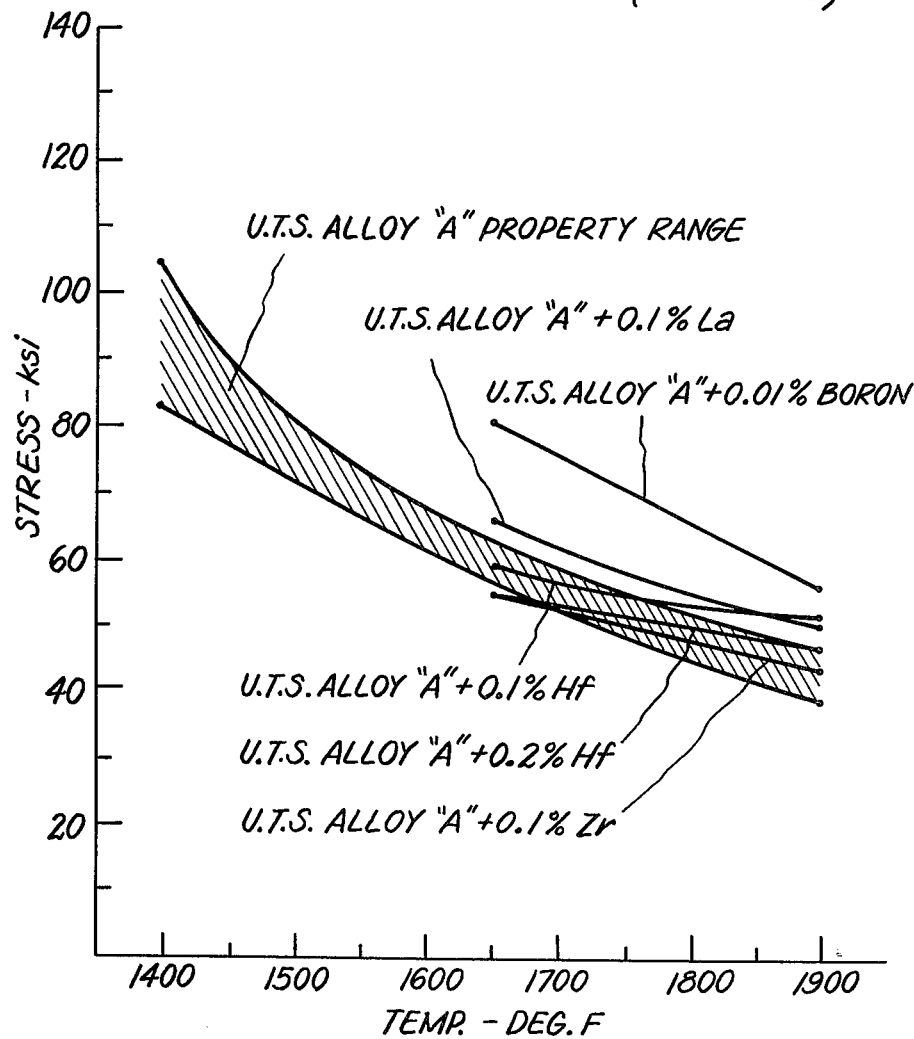
FIG. 1 is a graphical representation of the transverse tensile strength of a series of unidirectionally solidified nickel-base carbide-fiber-reinforced superalloy compositions containing on a weight percent basis, e.g. 69.46% Ni, 6.3% Re, 1.9% Cr, 6.5% Al, 8.0% Ta, 0.24% C, 3.7% Co, and 3.9% V, i.e. alloy "A.
Figure 2:
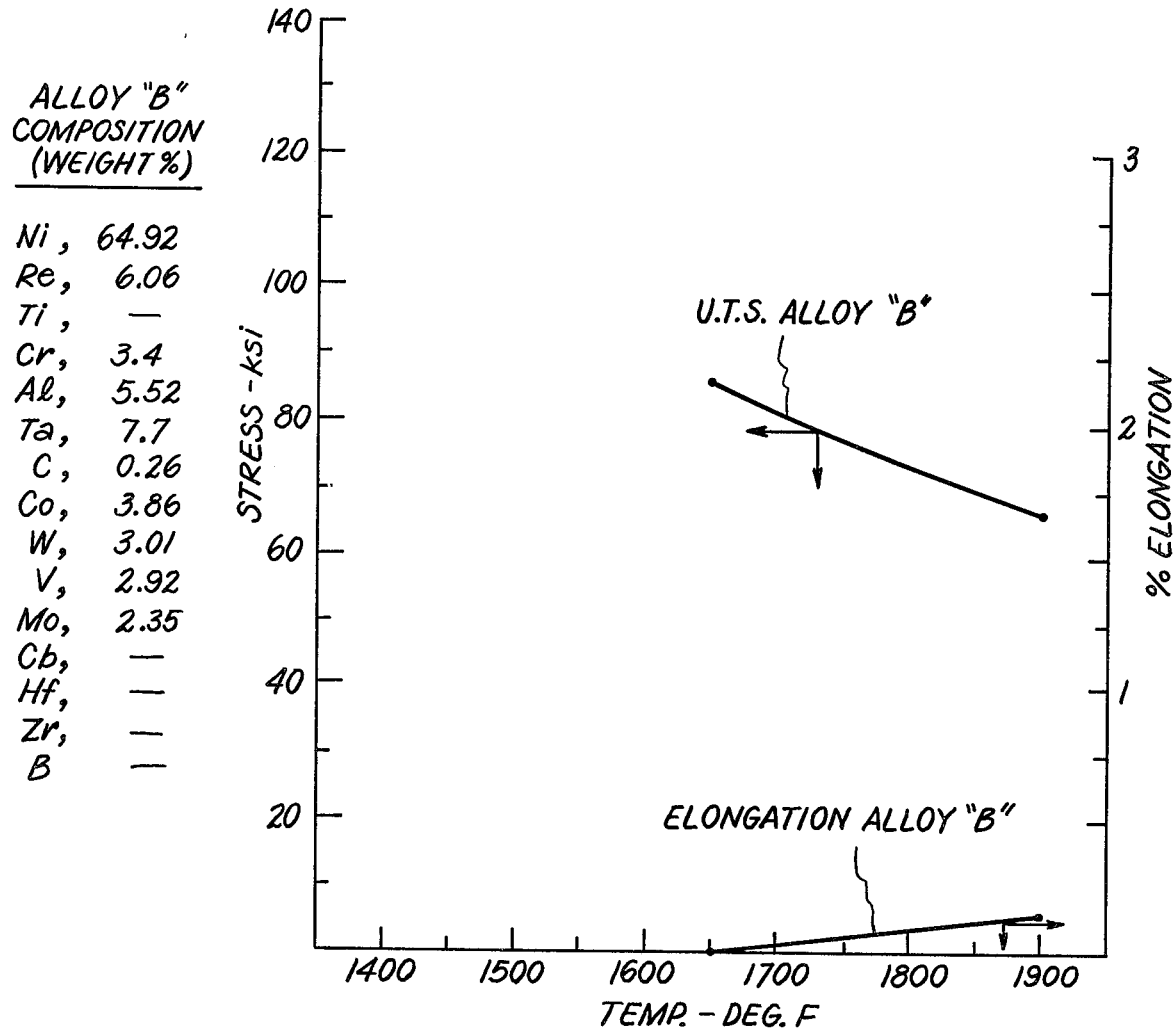
FIG. 2 is a graphical representation of the transverse tensile behavior of a directionally solidified nickel-base carbide fiber reinforced superalloy composition containing on a weight basis: 64.92% Ni, 6.06% Re, 3.4% Cr, 5.52% Al, 7.7% Ta, 0.26% C, 3.86% Co, 3.01% W, 2.92% V, 2.35% Mo, i.e. alloy "B." Alloy "B," which is within the composition range of Smashey's U.S. Pat. No. 3,904,402, is essentially nonductile, exhibiting low transverse ductility at elevated temperatures, i.e. high temperature transverse tensile elongation values equal to or less than 0.2% at 1650° F. to 1900° F.
Figure 3:
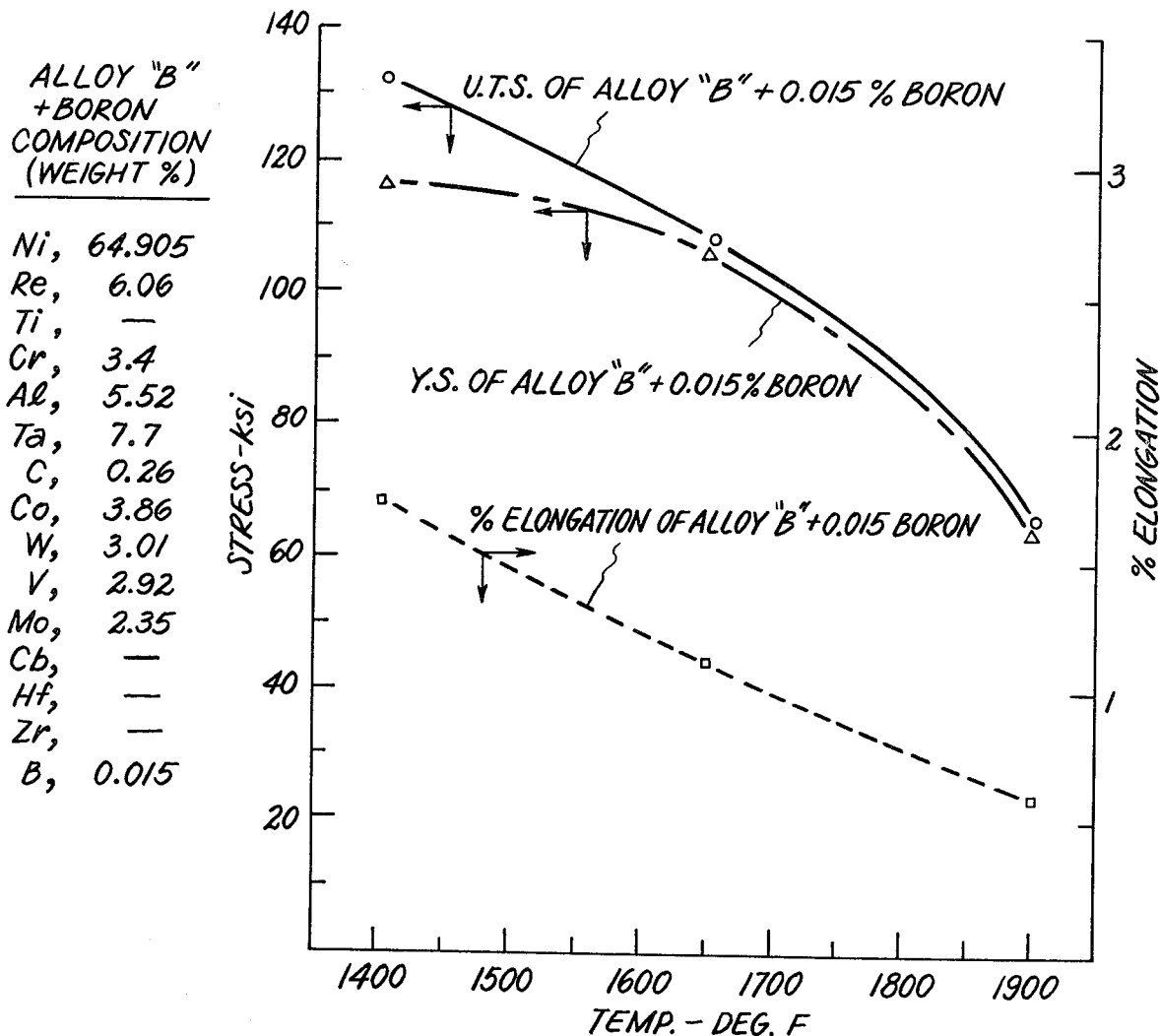
FIG. 3 is a graphical representation of the transverse tensile behavior of the unidirectionally solidified nickel-base carbide-fiber-reinforced superalloy composition of alloy "B" plus about 0.015% w/o boron. As illustrated, this boron-containing alloy exhibits improved ductility with transverse tensile elongation greater than 1% at low temperatures, i.e. temperatures within the range of from room temperature to about 1650° F. Above 1650° F. transverse tensile elongation declines slightly; however, at all temperatures boron addition markedly improves tensile behavior.
Figure 4:
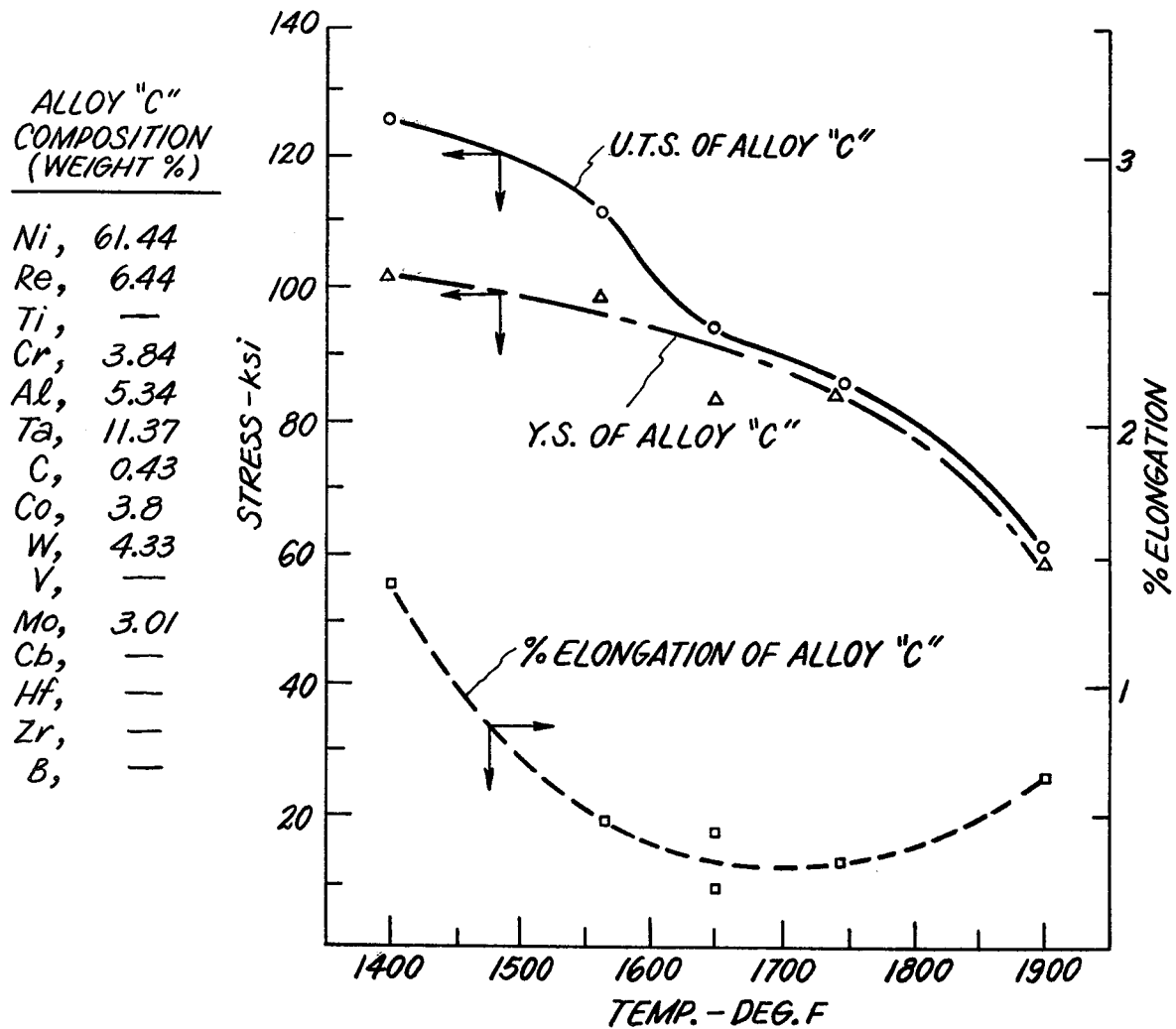
FIG. 4 is a graphical representation of the transverse tensile behavior of a unidirectionally solidified nickel-base carbide fiber reinforced superalloy composition containing on a weight percent basis: 61.44% Ni, 6.44% Re, 3.84% Cr, 5.34% Al, 11.37% Ta, 0.43% C, 3.8% Co, 4.33% W, and 3.01% Mo, i.e. alloy "C." Alloy "C" is within the compositional range taught by Henry in U.S. Ser. No. 34,154. As illustrated, this alloy also exhibits transverse tensile elongation values which fall below 1% at elevated temperatures.
Figure 5:
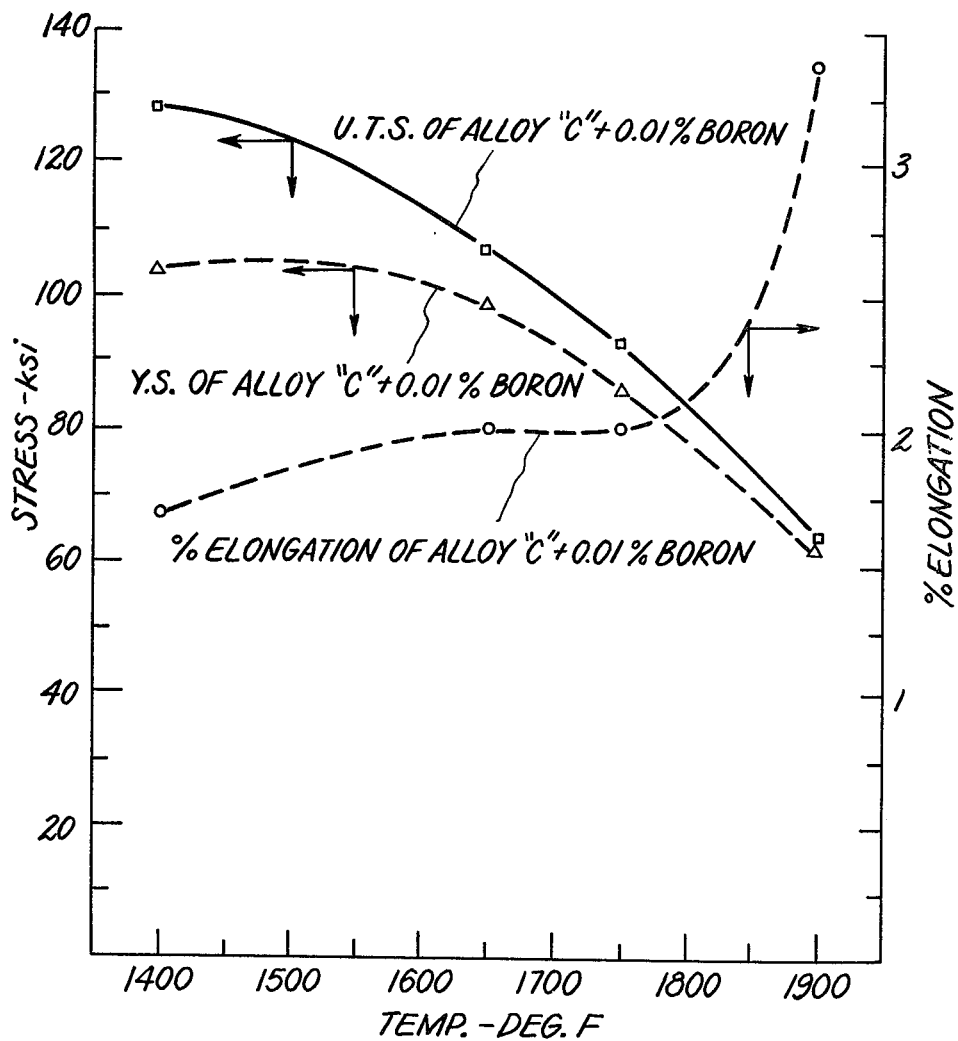
FIG. 5 is a graphical representation of the transverse tensile behavior of alloy "C" plus 0.01% w/o boron. As illustrated, this boron containing alloy exhibits transverse tensile elongation in excess of 1% at all temperatures tested.
Figure 6:
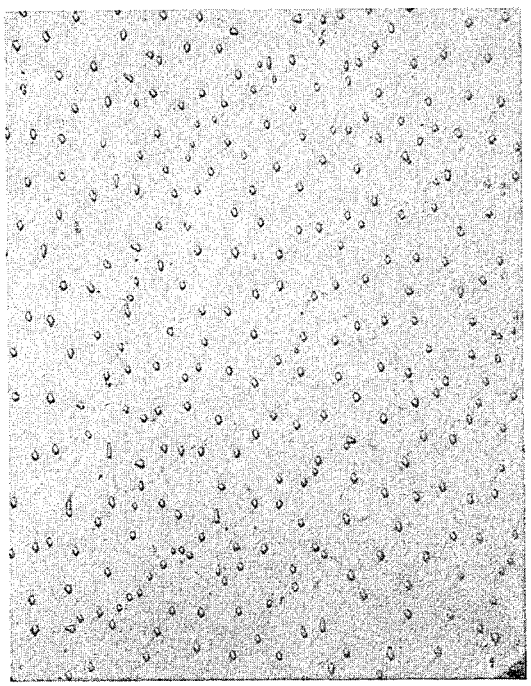
FIGS. 6, 7, and 8 are photomicrographs of transverse and longitudinal sections, respectively, of the aligned carbide fiber microstructure formed during unidirectional solidification of alloy "C."
Figure 7:
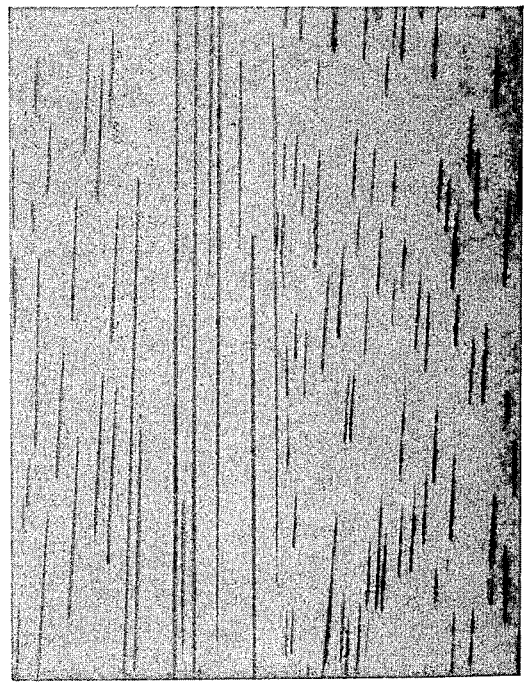
Figure 8:
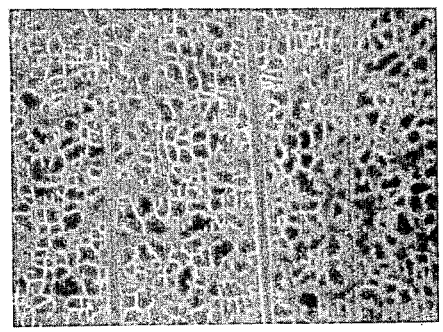

The data represented in FIGS. 1-5 is based on the evaluation of a series of alloys of the various compositions noted in the figures which were melted in an inert argon atmosphere in $Al_2O_3$ or MgO crucibles, and chill-cast into copper bar molds. Specimen castings were planar front solidified to provide the unidirectional article specimens used for subsequent testing. Mechanical test specimens for longitudinal properties were machined from the ingots parallel to the growth direction. To obtain transverse properties, test specimens were machined normal to the growth direction.

Set out in Table I hereafter is a resume of the Transverse Tension Test Data which formed the basis of the data illustrated by FIGS. 1-5.

| Transverse Stress Test Data (As Solidified) | | | | | |
|---|---|---|---|---|---|
| Example | Composition | Temp. (°F.) | 0.2% Y.S. (ksi) | U.T.S. (ksi) | Elong. (%) |
| 1 | Alloy "A" | 1400 | — | 87 | 0.16 |
| 2 | " | " | — | 82 | 0 |
| 3 | " | " | — | 94 | 0.04 |
| 4 | " | " | 100 | 104 | 0.36 |
| 5 | " | 1650 | — | 58 | 0 |
| 6 | " | " | — | 59 | 0 |
| 7 | " | " | — | 58 | 0 |
| 8 | " | 1900 | — | 39 | 0 |
| 9 | " | " | — | 44 | 0 |
| 10 | Alloy "A" + Boron | RT | 59 | 102 | 14 |
| 11 | " | 800 | 89 | 109 | 0.44 |
| 12 | " | 1200 | 113 | 113 | 0.2 |
| 13 | " | 1650 | — | 81 | 0 |
| 14 | " | 1900 | — | 56 | 0.04 |
| 15 | Alloy "B" | 1600 | — | 84 | 0 |
| 16 | " | 1900 | 66 | 66 | 0.2 |
| 17 | Alloy "B" + Boron | RT | 115 | 143 | 5.6 |
| 18 | " | 800 | 114 | 134 | 12 |
| 19 | " | 1200 | 110 | 123 | 2.9 |
| 20 | " | 1400 | 116 | 132 | 1.7 |
| 21 | " | 1650 | 106 | 108 | 1.1 |
| 22 | " | 1900 | 64 | 67 | 0.60 |

-continued

| Transverse Stress Test Data (As Solidified) | | | | | |
|---|---|---|---|---|---|
| Example | Composition | Temp. (°F.) | 0.2% Y.S. (ksi) | U.T.S. (ksi) | Elong. (%) |
| 23 | Alloy "C" | RT | 109 | 151 | 13 |
| 24 | " | 800 | 112 | 134 | 5.8 |
| 25 | " | 1200 | 106 | 126 | 2.9 |
| 26 | " | 1400 | 103 | 125 | 1.4 |
| 27 | " | 1560 | 109 | 113 | 0.49 |
| 28 | " | 1650 | 94 | 94 | 0.22 |
| 29 | " | 1650 | 81 | 94 | 0.44 |
| 30 | " | 1740 | 85 | 87 | 0.31 |
| 31 | " | 1900 | 60 | 62 | 0.67 |
| 32 | Alloy "C" + Boron | 1000 | 108 | 128 | 4.9 |
| 33 | " | 1200 | 111 | 125 | 1.3 |
| 34 | " | 1400 | 104 | 129 | 1.6 |
| 35 | " | 1650 | 99 | 107 | 2.0 |
| 36 | " | 1740 | 86 | 93 | 2.0 |
| 37 | " | 1900 | 64 | 64 | 4.3 |

Set out in Table II hereafter is a resume of the Longitudinal Stress Rupture Test Data associated with alloys of the compositions of FIGS. 1-5:

TABLE II

| Longitudinal Stress Rupture Test Data (As Solidified) | | | | | | |
|---|---|---|---|---|---|---|
| Ex. | Composition | Temp. (°F.) | Stress (ksi) | Life (hrs) | R.A. (%) | Elong. (%) |
| 38 | Alloy "A" | 1742 | 70 | 19* | — | — |
| 39 | Alloy "A" | 1980 | 30 | 43* | — | — |
| 40 | Alloy "A" + Boron | 1742 | 70 | 20.05 | 19.5 | 13.3 |
| 41 | Alloy "A" + Boron | 1980 | 30 | 40.44 | 35.6 | 19.6 |
| 42 | Alloy "B" | 1742 | 70 | 6.55 | 17.1 | 14.4 |
| 43 | Alloy "B" | 1980 | 30 | 16.64 | 54.3 | 14.7 |
| 44 | Alloy "B" + Boron | 1742 | 70 | 8.54 | 18.8 | 11.1 |
| 45 | Alloy "B" + Boron | 1980 | 30 | 25.16 | 60.9 | 14.2 |
| 46 | Alloy "C" | 1742 | 70 | 7* | — | — |
| 47 | Alloy "C" | 1980 | 30 | 52* | — | — |
| 48 | Alloy "C" + Boron | 1742 | 70 | 6.51 | 18.4 | 14.2 |
| 49 | Alloy "C" + Boron | 1980 | 30 | 44.5+ | — | — |

*Extrapolated from other test conditions

As used in the above Tables, "Y.S." means Yield Strength, "U.T.S" means Ultimate Tensile Strength, "ksi" means thousands of pounds per square inch, "Elong." means Elongation, "R.A." means Reduction in Area, and "RT" means room temperature (about 70° F.).

With the addition of boron in amounts in excess of impurity amounts, e.g. greater than about 0.001% B, unidirectionally solidified carbide fiber reinforced nickel-base superalloys exhibit greatly improved transverse tensile behavior.

Alloy melt compositions within the scope of this invention which rely on tantalum carbide fibers as a reinforcing phase on a weight percent basis, follow:

| | Alloy Compositions | | |
|---|---|---|---|
| Elements | Base | Preferred | More Preferred |
| Ni | bal. | bal. | bal. |

-continued

| Elements | Alloy Compositions | | |
|---|---|---|---|
| | Base | Preferred | More Preferred |
| Re | 0–9 | 0–9 | 0.5–7 |
| Ti | 0–<0.8 | <0.8 | <0.8 |
| Cr | 0–20 | 2–10 | 2–8 |
| Al | 0–10 | 2–9 | 4–7 |
| Ta | 3–15 | 3–15 | 5–13 |
| C | 0.1–1.0 | 0.1–0.8 | 0.1–0.7 |
| Co | 0–20 | <10 | <5 |
| W | 0–20 | <12.0 | <6.0 |
| V | 0–7 | <0.5 | <0.2 |
| Mo | 0–10 | <0.5 | <0.5 |
| Cb | 0–3 | <2.0 | <1.0 |
| Hf | 0–3 | <0.2 | <0.15 |
| Zr | 0–1.5 | <0.2 | <0.15 |
| B | 0.001–0.1 | 0.001–0.05 | 0.001–0.02 |

As used herein and in the appended claims, an article of manufacture of this invention includes—however is not limited to—a unidirectionally solidified anisotropic metallic body comprising a Ni-base superalloy containing a gamma/gamma-prime matrix wherein the matrix contains a solid solution gamma phase and an ordered equiaxed precipitate strengthened gamma-prime phase, further wherein the gamma/gamma-prime matrix has an aligned eutectic reinforcing carbide phase embedded therein.

Based on the Figures, Tables and Alloy Compositions set out herein, other alloy compositions within the scope of this invention—without departing from the concept of boron containing carbide-fiber-reinforced eutectic nickel-base superalloys—will be apparent to those skilled in the art.

We claim:

1. An article of manufacture having improved transverse ductility and strength properties comprising a unidirectionally solidified anisotropic metallic composite body comprising:
    A Ni-base matrix consisting essentially of, at least an amount in excess of an impurity amount of B, the balance being essentially nickel and incidental impurities, and
    an aligned eutectic reinforcing fibrous phase selected from carbides of the group consisting of Ti, V, Cb, Hf, Zr and Ta and their alloys and mixtures embedded in the matrix.

2. An article of manufacture having improved transverse ductility and strength properties comprising a unidirectionally solidified anisotropic metallic composite body comprising:
    a Ni-base matrix consisting essentially of, on a weight basis, at least an amount in excess of an impurity amount up to 0.02% of B, 0–9% Re, 0–<0.8% Ti, 0–20% Cr, 0–10% Al, 3–15% Ta, 0.1–1% C, 0–20% Co, 0–20% W, 0–7% V, 0–10% Mo, 0–3% Cb, 0–3% Hf, 0–1.5% Zr, the balance being essentially nickel and incidental impurities, and
    an aligned eutectic reinforcing fibrous phase selected from carbides of the group consisting of Ti, V, Cb, Hf, Zr and Ta and their alloys and mixtures embedded in the matrix.

3. The article of claim 1 wherein the superalloy contains about, on a weight basis, <0.02 B, 0–9% Re, <0.8% Ti, 2–10% Cr, 2–9% Al, 3–15% Ta, 0.1–0.8% C, <10% Co, <12% W, <0.5% V, <5% Mo, <2% Cb, <0.2% Hf, <0.2% Zr, the balance being essentially Ni and incidental impurities.

4. The article of claim 3 wherein the superalloy contains about, on a weight basis, 0.001–0.02% B, 0.5–7% Re, <0.8% Ti, 2–8% Cr, 4–7% Al, 5–13% Ta, 0.1–0.7% C, <5% Co, <6.0% W, <0.2% V, <5.0% Mo, <1.0% Cb, <0.15% Hf, <0.15% Zr, the balance being essentially Ni and incidental impurities.

5. The article of claim 1 wherein the eutectic carbide reinforcing fibrous phase is predominantly TaC.

6. An alloy capable of developing a unidirectionally solidified anisotropic article containing an aligned eutectic reinforcing fibrous phase having improved transverse ductility and strength properties, the alloy consisting essentially of on a weight basis, 0.001–0.02 B, 0–9% Re, 0–<0.8% Ti, 0–20% Cr, 0–10% Al, 3–15% Ta, 0.1–1% C, 0–20% Co, 0–20% W, 0–7% V, 0–10% Mo, 0–3% Cb, <0.15% Hf, 0–1.5% Zr, the balance being essentially Ni and incidental impurities.

7. An alloy capable of developing a unidirectionally solidified anisotropic article containing an aligned eutectic reinforcing fibrous phase having improved transverse ductility and strength properties, the alloy consisting essentially of, on a weight basis, 0.01–0.02% B, 0–9% Re, <0.8% Ti, 2–10% Cr, 2–9% Al, 3–15% Ta, 0.1–0.8% C, <10% Co, <12% W, <0.5% V, <5% Mo, <2% Cb, <0.15% Hf, <0.2% Zr, the balance being essentially Ni and incidental impurities.

8. An alloy capable of developing a unidirectionally solidified anisotropic article containing an aligned eutectic reinforcing fibrous phase having improved transverse ductility and strength properties, the alloy consisting essentially of, on a weight basis, 0.01–0.02% B, 0.5–7% Re, <0.8% Ti, 2–8% Cr, 4–7% Al, 5–13% Ta, 0.1–0.7% C, <5% Co, <6.0% W, <0.2% V, <5.0% Mo, <1.0% Cb, <0.15% Hf, <0.15% Zr, the balance being essentially Ni and incidental impurities.

9. An alloy capable of developing a unidirectionally solidified anisotropic article containing an aligned eutectic reinforcing fibrous phase having improved transverse ductility and strength properties, the alloy consisting essentially of, on a weight basis, 0.01% B, 6.44% Re, 3.84% Cr, 5.34% Al, 11.37% Ta, 0.43% C, 3.8% Co, 4.33% W, 3.01% Mo, 61.44% Ni and incidental impurities.

10. An article of manufacture having improved transverse ductility and strength properties comprising a unidirectionally solidified anisotropic metallic composite body comprising:
    a Ni-base matrix consisting essentially of, at least an amount in excess of incidental impurity amounts of B, along with elements selected from the group consisting of Re, Ti, Cr, Al, Ta, C, Co, W, V, Mo, Cb, Hf, and Zr, including incidental impurities; and
    an aligned eutectic reinforcing fibrous phase selected from carbides of the group consisting of Ti, V, Cb, Hf, Zr and Ta, including their alloys and mixtures embedded in the matrix.

* * * * *